(12) United States Patent
Huang et al.

(10) Patent No.: US 10,325,634 B2
(45) Date of Patent: *Jun. 18, 2019

(54) DIFFERENTIAL SENSING CIRCUIT WITH DYNAMIC VOLTAGE REFERENCE FOR SINGLE-ENDED BIT LINE MEMORY

(71) Applicant: MediaTek Inc., Hsin-Chu (TW)

(72) Inventors: Shih-Huang Huang, Hsin-Chu (TW); Rei-Fu Huang, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/441,480

(22) Filed: Feb. 24, 2017

(65) Prior Publication Data

US 2017/0169868 A1    Jun. 15, 2017

Related U.S. Application Data

(63) Continuation of application No. 14/634,898, filed on Mar. 2, 2015, now Pat. No. 9,659,606.

(Continued)

(51) Int. Cl.
*G11C 7/12* (2006.01)
*G11C 7/14* (2006.01)
(Continued)

(52) U.S. Cl.
CPC ........... *G11C 7/12* (2013.01); *G11C 7/062* (2013.01); *G11C 7/08* (2013.01); *G11C 7/14* (2013.01); *G11C 7/22* (2013.01)

(58) Field of Classification Search
CPC .. G11C 7/12; G11C 7/062; G11C 7/08; G11C 7/14
(Continued)

(56) References Cited

U.S. PATENT DOCUMENTS 8,289,091 B2 * 10/2012 Yang .................... H03K 3/0231
                                                        331/111
9,659,606 B2   5/2017 Huang et al.
(Continued)

FOREIGN PATENT DOCUMENTS

CN      1506976 A    6/2004
CN    101609710 A   12/2009
(Continued)

OTHER PUBLICATIONS

U.S. Appl. No. 14/634,898, filed Mar. 2, 2015, Huang et al.

*Primary Examiner* — Fernando Hidalgo
(74) *Attorney, Agent, or Firm* — Wolf, Greenfield & Sacks, P.C.

(57) ABSTRACT

The present invention provides a differential sensing circuit with a dynamic voltage reference for a single-ended bit line memory is disclosed. The exemplary differential sensing circuit comprises: a dynamic voltage reference generating unit and a differential sensing amplifying unit. The dynamic voltage reference generating unit is coupled to an input voltage, and utilized for receiving a setting signal to generate the dynamic voltage reference. The differential sensing amplifying unit is coupled to the single-ended bit line memory and the dynamic voltage reference generating unit, and utilized for receiving at least an input signal from the single-ended bit line memory and the dynamic voltage reference from the dynamic voltage reference generating unit, so as to generate at least an output signal accordingly.

17 Claims, 4 Drawing Sheets

Related U.S. Application Data

(60) Provisional application No. 62/092,852, filed on Dec. 17, 2014.

(51) Int. Cl.
  *G11C 7/08* (2006.01)
  *G11C 7/22* (2006.01)
  *G11C 7/06* (2006.01)

(58) Field of Classification Search
  USPC ......... 365/207, 189.09, 185.21, 185.22, 129, 365/189.011, 189.15, 190, 189.07, 189.7
  See application file for complete search history.

(56) References Cited

U.S. PATENT DOCUMENTS

| | | | |
|---|---|---|---|
| 2004/0008078 A1 | 1/2004 | Kim | |
| 2010/0039173 A1 | 2/2010 | Chang et al. | |
| 2012/0250442 A1* | 10/2012 | Roy | G11C 11/4091 365/203 |
| 2012/0300566 A1 | 11/2012 | Mueller et al. | |
| 2013/0051114 A1* | 2/2013 | Kim | G11C 11/1673 365/145 |
| 2013/0201773 A1* | 8/2013 | Kim | G11C 7/22 365/189.14 |
| 2014/0056089 A1* | 2/2014 | Vimercati | H03F 3/45762 365/203 |
| 2014/0126264 A1* | 5/2014 | Watanabe | G11C 15/04 365/49.17 |
| 2014/0218092 A1* | 8/2014 | Luo | H03K 3/012 327/262 |
| 2015/0117120 A1 | 4/2015 | Barth, Jr. et al. | |
| 2015/0170730 A1* | 6/2015 | Antonyan | G11C 11/4099 365/189.07 |
| 2016/0180894 A1 | 6/2016 | Huang et al. | |
| 2016/0204746 A1* | 7/2016 | Bedarida | G11C 7/02 365/189.011 |

FOREIGN PATENT DOCUMENTS

| | | |
|---|---|---|
| CN | 102034540 A | 4/2011 |
| CN | 103247336 A | 8/2013 |
| EP | 224125 B1 | 7/1993 |

* cited by examiner

DIFFERENTIAL SENSING CIRCUIT WITH DYNAMIC VOLTAGE REFERENCE FOR SINGLE-ENDED BIT LINE MEMORY

CROSS REFERENCE TO RELATED APPLICATIONS

This application is a continuation of U.S. application Ser. No. 14/634,898, filed Mar. 2, 2015, which claims the benefit of U.S. Provisional Application No. 62/092,852, filed Dec. 17, 2014, each of which is hereby incorporated by reference in its entirety.

BACKGROUND

The disclosed embodiments of the present invention relate to a differential sensing circuit, and more particularly, to a differential sensing circuit with a dynamic voltage reference for a single-ended bit line memory.

About a conventional single-ended sensing circuit for a single-ended bit line memory, in order to ensure noise immune operation, the conventional single-ended sensing circuit requires that the bit line is discharged fully (rely on the trip voltage of an inverter, wherein a sense margin is about 0.5 VCC). For this reason, the conventional single-ended sensing circuit reads are typically slower than differential sensing reads. About another conventional single-ended sensing circuit for a single-ended bit line memory, in order to have high performance design, the conventional single-ended sensing circuit adopts large signal sensing feature domino style hierarchical bit lines (i.e. short local read bit-lines). However, the conventional single-ended sensing circuit results in a high power consumption problem.

In addition, please refer to FIG. 1. FIG. 1 is a conventional differential sensing circuit 100 for a single-ended bit line memory. As shown in FIG. 1, the conventional differential sensing circuit 100 comprises: a voltage down converter 102, a reference voltage generator 104 and a differential sensing amplifier 106. However, the conventional differential sensing circuit 100 needs the global voltage down converter 102 to generate the voltage reference for the differential sensing amplifier 106, wherein the global voltage down converter 102 suffers a DC current and requires a larger chip area.

SUMMARY

In accordance with exemplary embodiments of the present invention, a differential sensing circuit with a dynamic voltage reference for a single-ended bit line memory is proposed to solve the above-mentioned problem.

According to a first aspect of the present invention, an exemplary differential sensing circuit with a dynamic voltage reference for a single-ended bit line memory is disclosed. The exemplary differential sensing circuit comprises: a dynamic voltage reference generating unit and a differential sensing amplifying unit. The dynamic voltage reference generating unit is coupled to an input voltage, and utilized for receiving a setting signal to generate the dynamic voltage reference. The differential sensing amplifying unit is coupled to the single-ended bit line memory and the dynamic voltage reference generating unit, and utilized for receiving at least an input signal from the single-ended bit line memory and the dynamic voltage reference from the dynamic voltage reference generating unit, so as to generate at least an output signal accordingly.

Briefly summarized, the differential sensing circuit with the dynamic voltage reference disclosed by the present invention can improve performance and reduce dynamic power without suffering the DC current and requiring a larger chip area for the single-ended bit line memory, and the present invention is suitable for high speed and low power design.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The key idea of the present invention is to use a dynamic voltage reference generating unit to generating a dynamic voltage reference to a differential sensing circuit for a single-ended bit line memory such as like a read-only memory (ROM), a static random access memory (SRAM), a dynamic random access memory (DRAM), or a ternary content addressable memory (TCAM), so as to improve performance and reduce dynamic power without suffering the DC current for the single-ended bit line memory, and the present invention is suitable for high speed and low power design. Further details of the proposed constellation phase rotation scheme are described as below.

Figure 1:
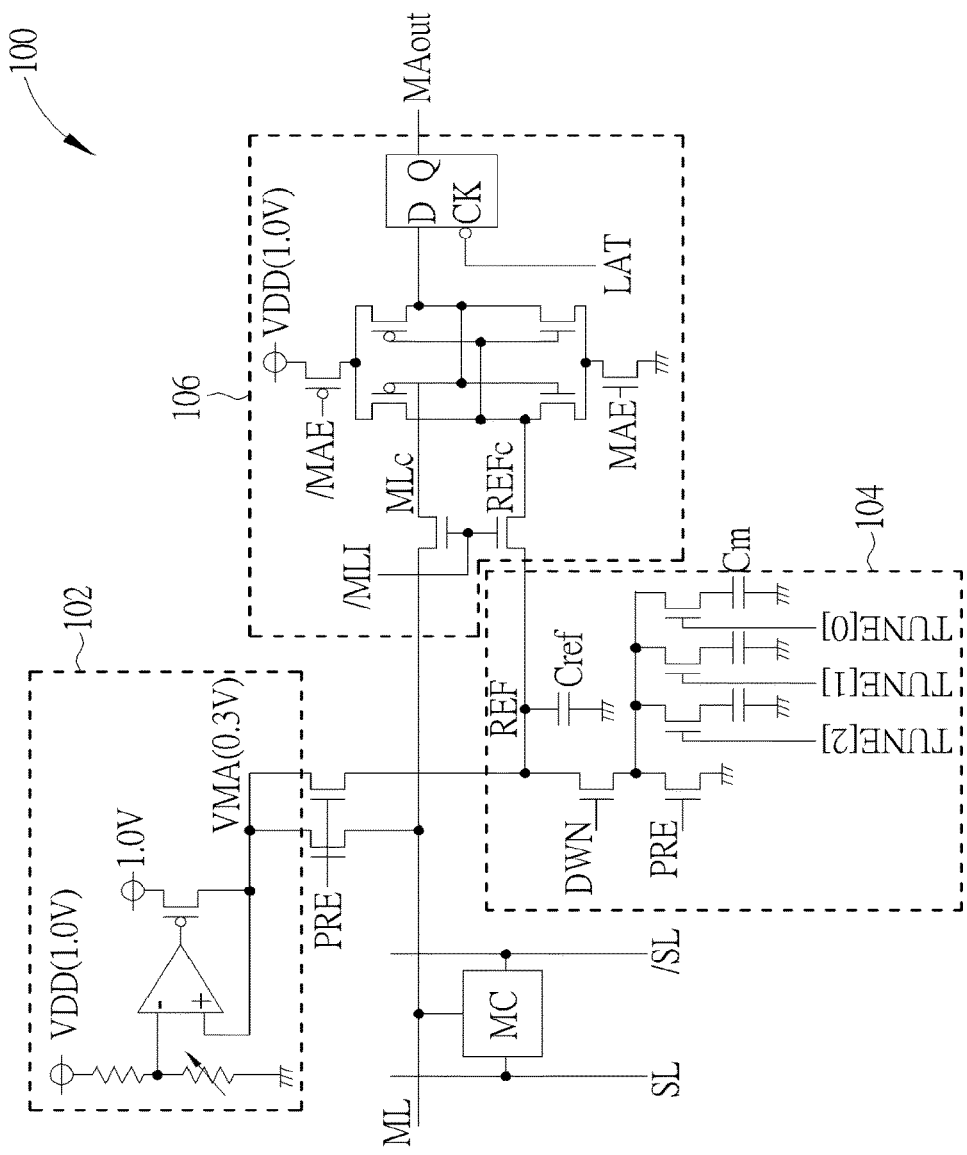
FIG. 1 is a conventional differential sensing circuit for a single-ended bit line memory.
Figure 2:
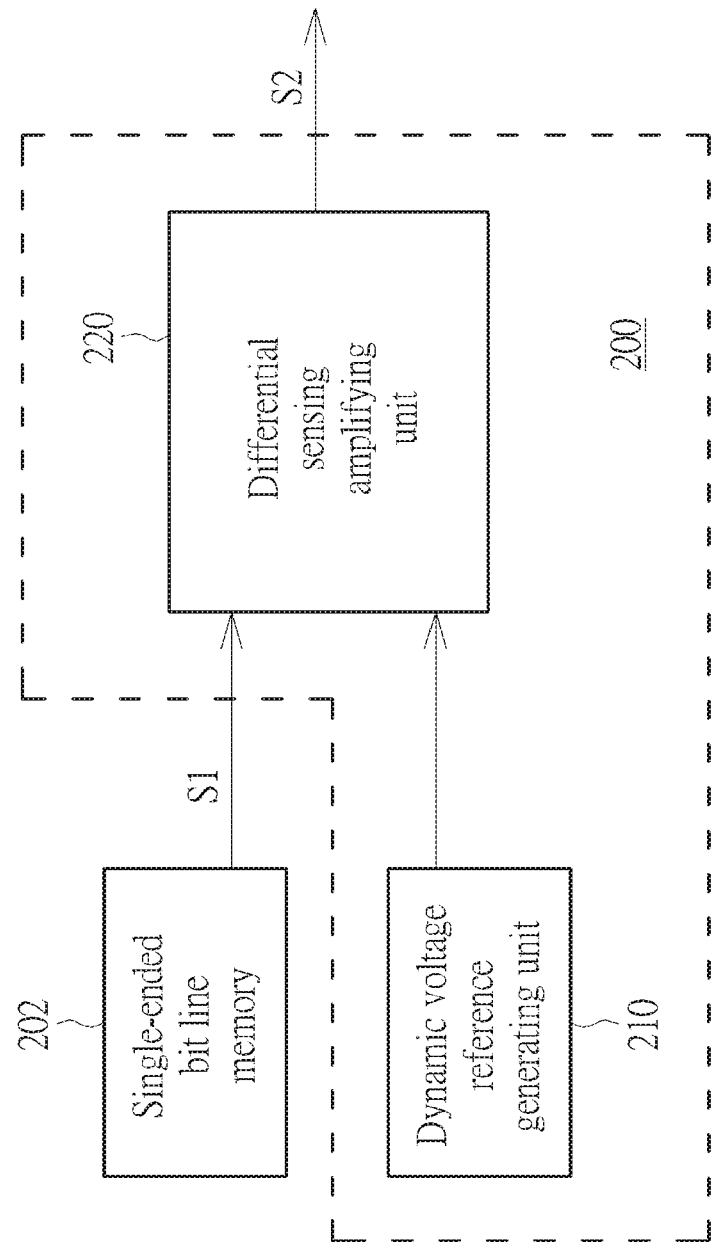
FIG. 2 is a simplified block diagram of a differential sensing circuit with a dynamic voltage reference for a single-ended bit line memory according to an exemplary embodiment of the present invention

Please refer to FIG. 2. FIG. 2 is a simplified block diagram of a differential sensing circuit 200 with a dynamic voltage reference Vref for a single-ended bit line memory 202 according to an exemplary embodiment of the present invention, wherein the single-ended bit line memory 202 can be a ROM, an SRAM, a DRAM, or a TCAM. As shown in FIG. 2, the differential sensing circuit 200 comprises: a dynamic voltage reference generating unit 210 and a differential sensing amplifying unit 220. The dynamic voltage reference generating unit 210 is coupled to an input voltage, and utilized for receiving a setting signal to generate the dynamic voltage reference Vref. The differential sensing amplifying unit 220 is coupled to the single-ended bit line memory 202 and the dynamic voltage reference generating unit 210, and utilized for receiving at least an input signal S1 from the single-ended bit line memory 202 and the dynamic voltage reference Vref from the dynamic voltage reference generating unit 210, so as to generate at least an output signal S2 accordingly. Please note that the above embodiment is only for an illustrative purpose and is not meant to be a limitation of the present invention.

Figure 3:
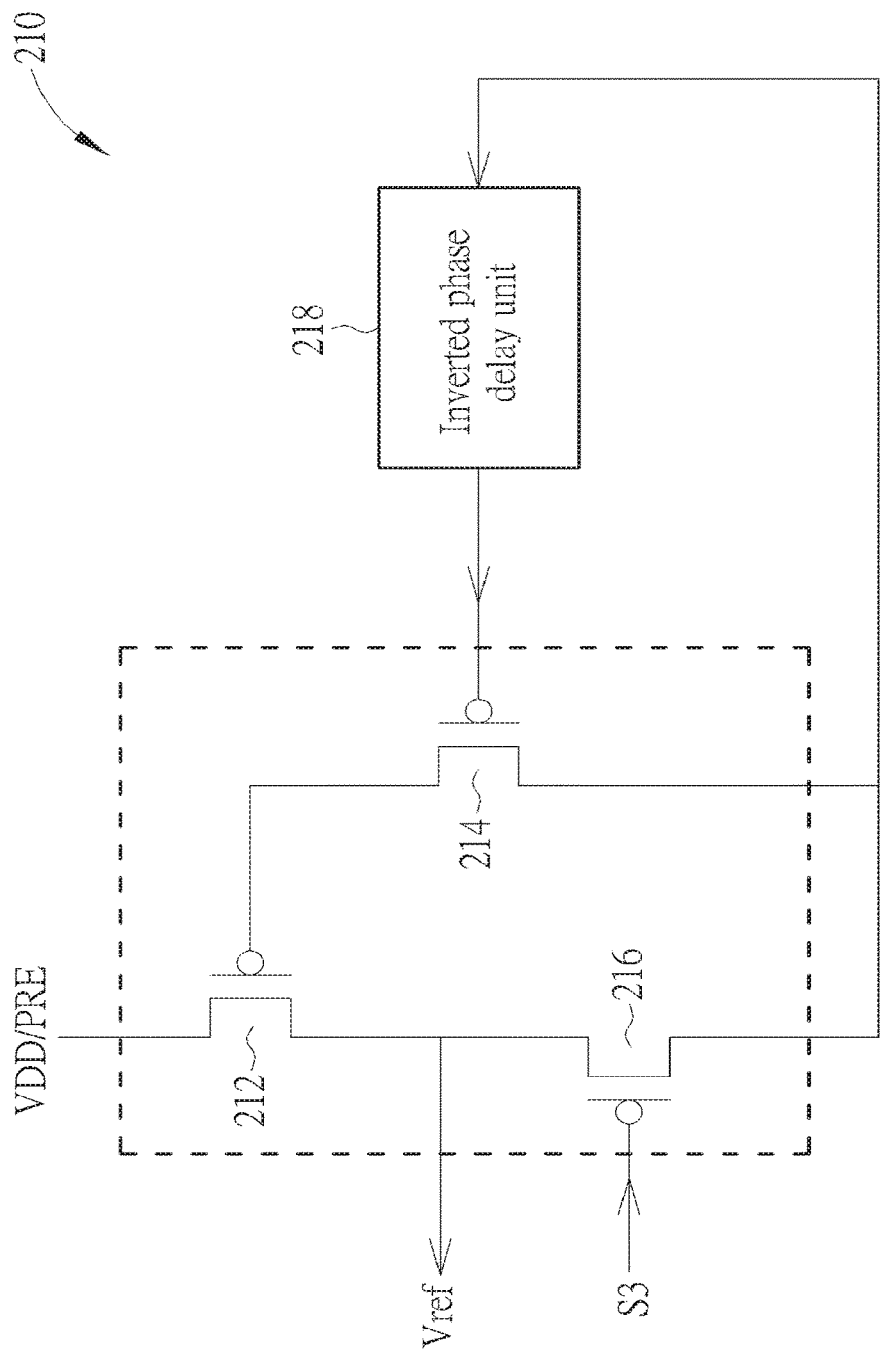
FIG. 3 is a simplified diagram of the dynamic voltage reference generating unit according to a first exemplary embodiment of the present invention.

Please refer to FIG. 3. FIG. 3 is a simplified diagram of the dynamic voltage reference generating unit 210 according to a first exemplary embodiment of the present invention. As shown in FIG. 3, the dynamic voltage reference generating unit 210 comprises: a first switch element 212, a second switch element 214, a third switch element 216, and an inverted phase delay unit 218. The first switch element 212 has a control terminal, a first terminal coupled to the input voltage, and a second terminal coupled to the differential sensing amplifying unit 220 in FIG. 2, wherein the input voltage can be an operating voltage VDD. In another exemplary embodiment, the input voltage also can be a precharging voltage PRE. The second switch element 214 has a control terminal coupled to the inverted phase delay unit 218, a first terminal coupled to the control terminal of the first switch element 212, and a second terminal coupled to the inverted phase delay unit 218. The third switch element 216 has a control terminal coupled to the setting signal S3, a first terminal coupled to the second terminal of the first switch element 212 and the differential sensing amplifying unit 220, and a second terminal coupled to the inverted phase delay unit 218. The inverted phase delay unit 218 has an input terminal coupled to the second terminal of the second switch element 214 and the second terminal of the third switch element 216, and an output terminal coupled to the control terminal of the second switch element 214, wherein the first switch element 212, the second switch element 214, and the third switch element 216 are P-type metal-oxide-semiconductor field-effect transistors (PMOSFETs), and the control terminal is a gate terminal of the PMOSFET, and the first terminal is a source terminal of the PMOSFET, and the second terminal a drain terminal of the PMOSFET. In other words, when the differential sensing circuit 200 comprises the dynamic voltage reference generating unit 210 in the first exemplary embodiment of the present invention, the differential sensing circuit 200 is a VDD differential sensing circuit, and the differential sensing amplifying unit 220 is a VDD differential sensing amplifying unit. When the dynamic voltage reference generating unit 210 receives the setting signal S3, the first switch element 212, the second switch element 214, and the third switch element 216 generate a .DELTA.V, and the dynamic voltage reference generating unit 210 generates the dynamic voltage reference Vref, wherein Vref=VDD−.DELTA.V. Please note that the above embodiment is only for an illustrative purpose and is not meant to be a limitation of the present invention. For example, the number of switch elements the dynamic voltage reference generating unit 210 can be changed according to different design requirements.

In addition, when the at least an inverted phase delay signal of the inverted phase delay unit is fixed (i.e. a number of inverters in inverted phase delay unit is fixed), the dynamic voltage reference Vref generated by the dynamic voltage reference generating unit 210 can be tuned by a ratio of sizes of the first switch element 212, the second switch element 214, and the third switch element 216. For example, if the second switch element 214 has a bigger size while the sizes of the first switch element 212 and the third switch element 216 are not changed, the dynamic voltage reference generating unit 210 generates a lower dynamic voltage reference Vref (i.e. the .DELTA.V is higher). On the other hand, if the second switch element 214 has a smaller size while the sizes of the first switch element 212 and the third switch element 216, the dynamic voltage reference generating unit 210 generates a higher dynamic voltage reference Vref (i.e. the .DELTA.V is lower). In addition, when the ratio of sizes of the first switch element 212, the second switch element 214, and the third switch element 216 is fixed, the dynamic voltage reference Vref generated by the dynamic voltage reference generating unit 210 can be tuned by the inverted phase delay unit. For example, if the inverted phase delay unit 218 has less inverters (e.g. only one inverter), then the dynamic voltage reference generating unit 210 generates a lower dynamic voltage reference Vref (i.e. the .DELTA.V is higher). On the other hand, if the inverted phase delay unit 218 has more inverters (e.g. three of more inverters), the dynamic voltage reference generating unit 210 generates a higher dynamic voltage reference Vref (i.e. the .DELTA.V is lower). In addition, if the differential sensing amplifying unit 220 is replaced by an asymmetric differential sensing amplifying unit, the present invention can improve the performance further for the single-ended bit line memory 202. Please note that the above embodiment is only for an illustrative purpose and is not meant to be a limitation of the present invention.

Figure 4:
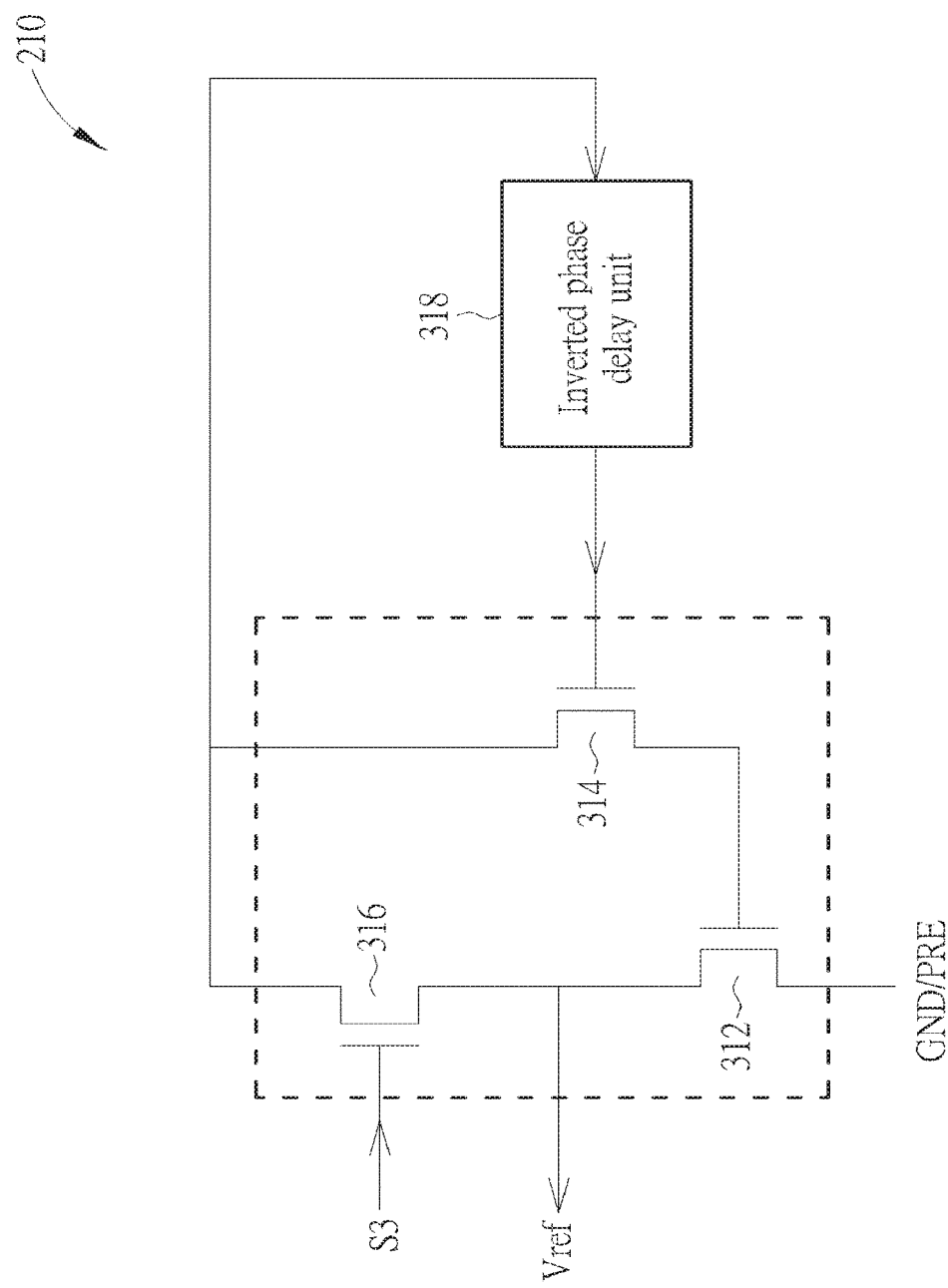
FIG. 4 is a simplified diagram of the dynamic voltage reference generating unit according to a second exemplary embodiment of the present invention.

Please refer to FIG. 4. FIG. 4 is a simplified diagram of the dynamic voltage reference generating unit 210 according to a second exemplary embodiment of the present invention. As shown in FIG. 4, the dynamic voltage reference generating unit 210 comprises: a first switch element 312, a second switch element 314, a third switch element 316, and an inverted phase delay unit 318. The first switch element 312 has a control terminal, a first terminal coupled to the input voltage, and a second terminal coupled to the differential sensing amplifying unit 220 in FIG. 2, wherein the input voltage can be a ground voltage GND. In another exemplary embodiment, the input voltage also can be a precharging voltage PRE. The second switch element 314 has a control terminal coupled to the inverted phase delay unit 318, a first terminal coupled to the control terminal of the first switch element 312, and a second terminal coupled to the inverted phase delay unit 318. The third switch element 316 has a control terminal coupled to the setting signal S3, a first terminal coupled to the second terminal of the first switch element 312 and the differential sensing amplifying unit 220, and a second terminal coupled to the inverted phase delay unit 318. The inverted phase delay unit 318 has an input terminal coupled to the second terminal of the second switch element 314 and the second terminal of the third switch element 316, and an output terminal coupled to the control terminal of the second switch element 314, wherein the first switch element 312, the second switch element 314, and the third switch element 316 are N-type metal-oxide-semiconductor field-effect transistors (NMOSFETs), and the control terminal is a gate terminal of the PMOSFET, and the first terminal is a source terminal of the NMOSFET, and the second terminal a drain terminal of the NMOSFET. In other words, when the differential sensing circuit 200 comprises the dynamic voltage reference generating unit 210 in the second exemplary embodiment of the present invention, the differential sensing circuit 200 is a GND differential sensing circuit, and the differential sensing amplifying unit 220 is a GND differential sensing amplifying unit. When the dynamic voltage reference generating unit 210 receives the setting signal S3, the first switch element 312, the second switch element 314, and the third switch element 316 generate a .DELTA.V, and the dynamic voltage reference generating unit 210 generates the dynamic voltage reference Vref, wherein Vref=.DELTA.V. Please note that the above embodiment is only for an illustrative purpose and is not meant to be a limitation of the present invention. For example, the number of switch elements the dynamic voltage reference generating unit 210 can be changed according to different design requirements.

In addition, when the at least an inverted phase delay signal of the inverted phase delay unit is fixed (i.e. a number of inverters in inverted phase delay unit is fixed), the dynamic voltage reference Vref generated by the dynamic voltage reference generating unit 210 can be tuned by a ratio of sizes of the first switch element 312, the second switch element 314, and the third switch element 316. For example, if the second switch element 314 has a bigger size while the sizes of the first switch element 312 and the third switch element 316 are not changed, the dynamic voltage reference generating unit 210 generates a lower dynamic voltage reference Vref. On the other hand, if the second switch element 314 has a smaller size while the sizes of the first switch element 312 and the third switch element 316, the dynamic voltage reference generating unit 210 generates a higher dynamic voltage reference Vref. In addition, when the ratio of sizes of the first switch element 312, the second switch element 314, and the third switch element 316 is fixed, the dynamic voltage reference Vref generated by the dynamic voltage reference generating unit 210 can be tuned by the inverted phase delay unit. For example, if the inverted phase delay unit 318 has less inverters (e.g. only one inverter), then the dynamic voltage reference generating unit 210 generates a lower dynamic voltage reference Vref. On the other hand, if the inverted phase delay unit 318 has more inverters (e.g. three of more inverters), the dynamic voltage reference generating unit 210 generates a higher dynamic voltage reference Vref. In addition, if the differential sensing amplifying unit 220 is replaced by an asymmetric differential sensing amplifying unit, the present invention can improve the performance further for the single-ended bit line memory 202. Please note that the above embodiment is only for an illustrative purpose and is not meant to be a limitation of the present invention.

Briefly summarized, the differential sensing circuit with the dynamic voltage reference disclosed by the present invention can improve performance and reduce dynamic power without suffering the DC current and requiring a larger chip area for the single-ended bit line memory, and the present invention is suitable for high speed and low power design.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A differential sensing circuit for a single-ended bit line memory, the differential sensing circuit comprising:
a dynamic voltage reference generating circuit configured to receive a setting signal and an input voltage, generate a dynamic voltage reference, and provide the dynamic voltage reference to a differential sensing amplifier, wherein the dynamic voltage reference generating circuit comprises:
a first transistor configured to receive the setting signal at a control terminal of the first transistor;
a second transistor in series with the first transistor; and
a third transistor coupled to a control terminal of the second transistor, wherein the control terminal of the second transistor is a gate terminal of the second transistor.

2. The differential sensing circuit of claim 1, wherein the input voltage is an operating voltage of the differential sensing amplifier.

3. The differential sensing circuit of claim 1, wherein the input voltage is greater than 0.3 V.

4. The differential sensing circuit of claim 1, wherein the input voltage is about 1 V.

5. The differential sensing circuit of claim 1, wherein the input voltage is a precharging voltage.

6. The differential sensing circuit of claim 1, wherein the first transistor is configured to provide the dynamic voltage reference at a second terminal of the first transistor.

7. The differential sensing circuit of claim 1, further comprising an inverted phase delay unit coupled to a control terminal of the third transistor.

8. The differential sensing circuit of claim 1, wherein the dynamic voltage reference is tuned by a ratio of sizes of the first transistor, the second transistor, and the third transistor.

9. The differential sensing circuit of claim 1, further comprising the differential sensing amplifier.

10. The differential sensing circuit of claim 9, wherein the differential amplifier receives a signal from the single-ended bit line memory.

11. The differential sensing circuit of claim 1, wherein the single-ended bit line memory is a read-only memory (ROM), a static random access memory (SRAM), a dynamic random access memory (DRAM), or a ternary content addressable memory (TCAM).

12. A memory device, comprising:
a single-ended bit line memory;
a differential sensing amplifier configured to receive a first input signal from the single-ended bit line memory; and
a dynamic voltage reference generating circuit configured to receive a setting signal and an input voltage, generate a dynamic voltage reference, and provide the dynamic voltage reference to the differential sensing amplifier as a second input signal, wherein the dynamic voltage reference generating circuit comprises:
a first transistor configured to receive the setting signal at a control terminal of the first transistor;
a second transistor in series with the first transistor; and
a third transistor coupled to a control terminal of the second transistor, wherein the control terminal of the second transistor is a gate terminal of the second transistor.

13. The memory device of claim 12, wherein the input voltage is an operating voltage.

14. The memory device of claim 12, wherein the input voltage is about 1 V.

15. The memory device of claim 12, wherein the input voltage is a precharging voltage.

16. The memory device of claim 12, wherein the single-ended bit line memory is a read-only memory (ROM), a static random access memory (SRAM), a dynamic random access memory (DRAM), or a ternary content addressable memory (TCAM).

17. The differential sensing circuit of claim 1, wherein the control terminal of the second transistor is configured to control a state of conductance of the second transistor in response to a voltage at the control terminal of the second transistor.

* * * * *